(12) United States Patent
Ayyapureddi

(10) Patent No.: US 12,399,649 B2
(45) Date of Patent: Aug. 26, 2025

(54) TECHNIQUES FOR FOUR CYCLE ACCESS COMMANDS

(71) Applicant: Micron Technology, Inc., Boise, ID (US)

(72) Inventor: Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 164 days.

(21) Appl. No.: 18/161,757

(22) Filed: Jan. 30, 2023

(65) Prior Publication Data

US 2023/0325120 A1 Oct. 12, 2023

Related U.S. Application Data

(60) Provisional application No. 63/328,503, filed on Apr. 7, 2022.

(51) Int. Cl.
*G06F 3/06* (2006.01)

(52) U.S. Cl.
CPC .......... *G06F 3/0659* (2013.01); *G06F 3/0604* (2013.01); *G06F 3/0656* (2013.01); *G06F 3/0674* (2013.01)

(58) Field of Classification Search
CPC .... G06F 3/0659; G06F 3/0604; G06F 3/0656; G06F 3/0674
See application file for complete search history.

(56) References Cited

U.S. PATENT DOCUMENTS

2003/0191916 A1\* 10/2003 McBrearty .......... G06F 11/1464
 711/112
2008/0320214 A1\* 12/2008 Ma .......................... G06F 3/064
 711/E12.008

\* cited by examiner

*Primary Examiner* — Jae U Yu
(74) *Attorney, Agent, or Firm* — Holland & Hart LLP

(57) ABSTRACT

Methods, systems, and devices for techniques for four cycle access commands are described. A memory device may communicate access commands with a host device over a command-address (CA) channel associated with multiple data channels. The host device may transmit an access command that includes an operation code indicating a type of the access command, a first address of the memory device that is a first target of the access command, and a second address of the memory device that is a second target of the access command. The first address may be associated with a first data channel, and the second address may be associated with a second data channel. Accordingly, the memory device and the host device may communicate first data corresponding to the first address over the first data channel and second data corresponding to the second address over the second data channel.

18 Claims, 9 Drawing Sheets

Command Truth Table

| Function | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| A1 | L1 | OP1 | OP2 | OP3 | OP4 | OP5 | BL | BA0 | BA1 | BG0 | BG1 | BG2 | CY | CA12 | CA13 |
|  | H1 | V | C3 | C4 | C5 | C6 | C7 | C8 | C9 | C10 | V | H | V | CID0 | CID1 |
|  | L2 | V | V | V | V | V | V | BA0 | BA1 | BG0 | BG1 | BG2 | CY | CID0 | CID2 |
|  | H2 | V | C3 | C4 | C5 | C6 | C7 | C8 | C9 | C10 | V | V | V | CID1 | CID3 |

FIG. 3

TECHNIQUES FOR FOUR CYCLE ACCESS COMMANDS

CROSS REFERENCE

The present application for patent claims the benefit of U.S. Provisional Patent Application No. 63/328,503 by AYYAPUREDDI, entitled "TECHNIQUES FOR FOUR CYCLE ACCESS COMMANDS," filed Apr. 7, 2022, assigned to the assignee hereof, and expressly incorporated by reference herein.

FIELD OF TECHNOLOGY

The following relates to one or more systems for memory, including techniques for four cycle access commands.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 3 illustrates an example of a command diagram that supports techniques for four cycle access commands in accordance with examples as disclosed herein.

DETAILED DESCRIPTION

Figure 1:
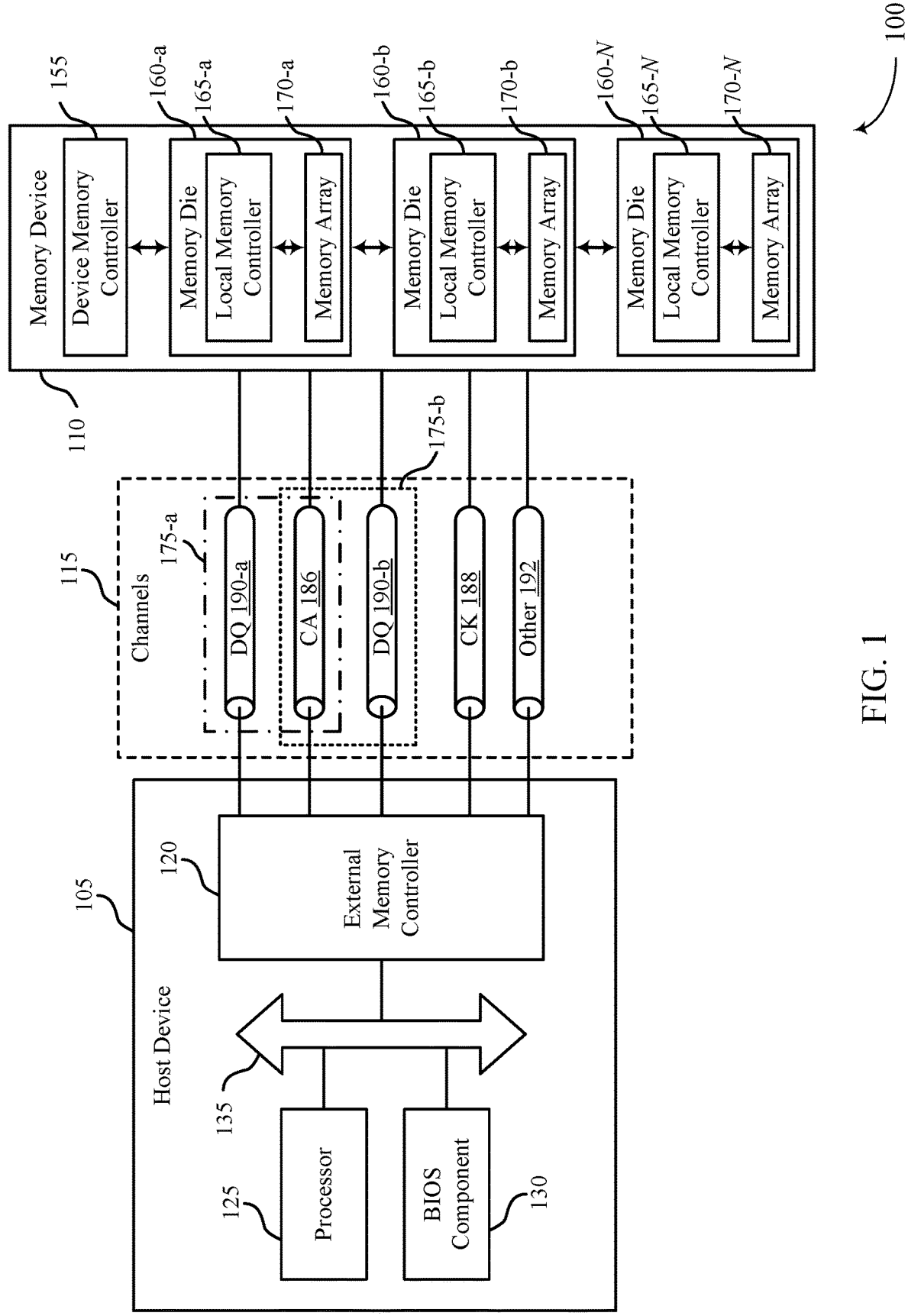
FIGS. 1 and 2 illustrate examples of systems that support techniques for four cycle access commands in accordance with examples as disclosed herein.

In some systems, a host device may transmit access commands (e.g., write commands, read commands) to a memory device over a command-address (CA) channel to support the communication of data with the memory device over a corresponding data channel. In some examples, the memory device and the host device may communicate information (e.g., access commands, data) over two or more pseudo-channels. For example, a memory die of the memory device may have a first portion (e.g., a first partition) for which data is communicated with the host device over a first data channel and a second portion (e.g., a second partition) for which data is communicated with the host device over a second data channel different from the first data channel. The first data channel and the second data channel may both be associated with the CA channel. That is, a first access command for communicating data over the first data channel and a second access command for communicating data over the second data channel may both be received over the CA channel. A first pseudo-channel between the memory die and the host device may be associated with communicating data to and from the first portion (e.g., over the first data channel), and a second pseudo-channel between the memory die and the host device may be associated with communicating data to and from the second portion (e.g., over the second data channel).

The memory die may support concurrent communication of data over the first pseudo-channel and the second pseudo-channel. For example, the memory die may concurrently transmit respective data to the host device over the first pseudo-channel and the second pseudo-channel or may concurrently receive data from the host device over the first pseudo-channel and the second pseudo-channel. In some cases, however, there may be timing offsets between the data communicated over the pseudo-channels, for example, due to command decoder timing constraints at the memory die. For example, in some cases, an access command (e.g., a two-cycle command) transmitted by a host device may include a single operation code indicating a type of the access command (e.g., a write operation, a read operation) and include a single target address of the memory die for the access command. Accordingly, to communicate data over the pseudo-channels, the host device may transmit a first access command including a target address within the first portion and a second access command including a target address within the second portion. The command decoder, however, may have timing constraints associated with decoding an operation code of an access command. As a result, a host device may transmit the access commands with a delay between transmitting a first access command and transmitting a second access command so that the command decoder may properly decode each access command. Such a delay or timing offset between access commands, however, may result in the subsequent timing offsets between the respective data communicated over the pseudo-channels, which may cause increased latency, reduced data rates, and wasted resources.

For example, the memory die may not support the transmission of data over one pseudo-channel concurrent with the reception of data over another pseudo channel. Accordingly, the memory die may wait until data transmission or reception is completed over both pseudo-channels before transitioning to receive or transmit data over the pseudo-channels. Thus, the timing offsets between the respective data may result in an increased effective time of transmitting or receiving the respective data over the pseudo-channels and result in wasted time during which data is not communicated over one pseudo-channel or the other. Additionally, in some cases, timing offsets between access commands for respective pseudo-channels may result in a post-amble of data communicated over one pseudo-channel to overlap with a preamble of data communicated over the other, which may increase decoding complexity or cause data communication failure.

Techniques, systems, and devices are described herein for communicating an access command having a format that may reduce or eliminate timing offsets between access commands for different pseudo-channels and reduce a likelihood of preamble and post-amble collisions, among other benefits. For example, a host device may be configured to transmit an access command to a memory die that includes a single operation code and two target addresses of the memory die. A first target address of the access command may be associated with communicating data over a first data channel (e.g., a first pseudo-channel), and a second target address of the access command may be associated with communicating data over a second data channel (e.g., a second pseudo-channel). The operation code may apply to both the first target address and the second target address. For example, the access operation indicated by the operation code may be for both target addresses. Based on the access command including a single operation code, the access command may include both target addresses without a delay therebetween (e.g., back-to-back) because, for example, the command decoder may decode a single operation code and the timing constraints associated with decoding multiple operation codes may not apply. As a result, the respective data communicated over the first data channel and the second data channel may be communicated without (e.g., or with reduced) timing offsets therebetween, which may reduce latency, increase data rates, increase resource utilization efficiency, and reduce a likelihood of preamble and post-amble collision, among other benefits.

Features of the disclosure are initially described in the context of systems as described with reference to FIGS. 1 and 2. Features of the disclosure are described in the context of a command diagram and communication sequences as described with reference to FIGS. 3 through 5. These and other features of the disclosure are further illustrated by and described with reference to apparatus diagrams and flowcharts that relate to techniques for four cycle access commands as described with reference to FIGS. 6 through 9.

FIG. 1 illustrates an example of a system 100 that supports techniques for four cycle access commands in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, clock signal channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, DQ channels 190 may be operable to communicate information (e.g., data, control information) between the host device 105 and the memory device 110. For example, the DQ channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

In some examples, the host device 105 and the memory device 110 may be configured to communicate information over two or more pseudo-channels 175. For example, a memory die 160 may be configured to communicate data with a first portion of the memory die over a pseudo-channel 175-a and data with a second portion of the memory die 160 over a pseudo-channel 175-b. In the example of FIG. 1, the pseudo-channel 175-a may include the CA channel 186 and a DQ channel 190-a, and the pseudo-channel 175-b may include the CA channel 186 and a DQ channel 190-b. For example, the pseudo-channels 175 may have a common command interface, but different DQ channels 190. That is, an access command for communicating data with the first portion of the memory die 160 may be received over the CA channel 186, and an access command for communicating data with the second portion of the memory die 160 may be received over the CA channel 186, but the respective data may be communicated over the corresponding DQ channels 190 (e.g., DQ channel 190-a and DQ channel 190-b, respectively).

The memory die 160 may support concurrent transmission or reception of data over the pseudo-channel 175-a and the pseudo-channel 175-b. In some cases, however, timing constraints associated with decoding operation codes of a command decoder of the memory device 110 (e.g., the device memory controller 155, a local memory controller 165 of the memory die 160) may result in delays between an access command for communicating data over the pseudo-channel 175-a and an access command for communicating data over the pseudo-channel 175-b. Such delays between access commands may result in subsequent delays or timing offsets between the respective data communicated over the pseudo-channels 175, which may cause increased latency, reduced data rates, reduced resource utilization efficiency, and preamble and post-amble collisions. Additionally, in some cases, the delays between successive access commands may be based on a data transfer rate between the memory die 160 and the host device. For example, as the data transfer rate increases (e.g., from 7200 megatransfers per second (MTS) to 12800 MTS) the delay between successive access commands may also increase (e.g., from 4 CLK cycles to 6 CLK cycles). Accordingly, as data transfer rates increase, the timing offset associated issues may be further exacerbated.

In accordance with examples described herein, the host device 105 may be configured to transmit an access command having a format that may reduce or eliminate timing offsets associated with concurrent communication of data over different pseudo-channels 175. For example, the host device 105 may be configured to transmit an access command to a memory die 160 that includes a single operation code and two target addresses of the memory die 160. A first target address of the access command may be associated with communicating data over the pseudo-channel 175-a, and a second target address of the access command may be associated with communicating data over the pseudo-channel 175-b. The operation code may apply to both the first target address and the second target address, and thus the access operation indicated by the operation code may be performed at both the first target address and the second target address without a timing offset therebetween. That is, the single access command may cause data transfer over both the pseudo-channel 175-a and the pseudo-channel 175-b, thereby eliminating a delay between respective access commands for the respective pseudo-channels. As a result, respective data may be communicated over the DQ channel 190-a and the DQ channel 190-b without (e.g., or with reduced) timing offsets therebetween.

Figure 2:
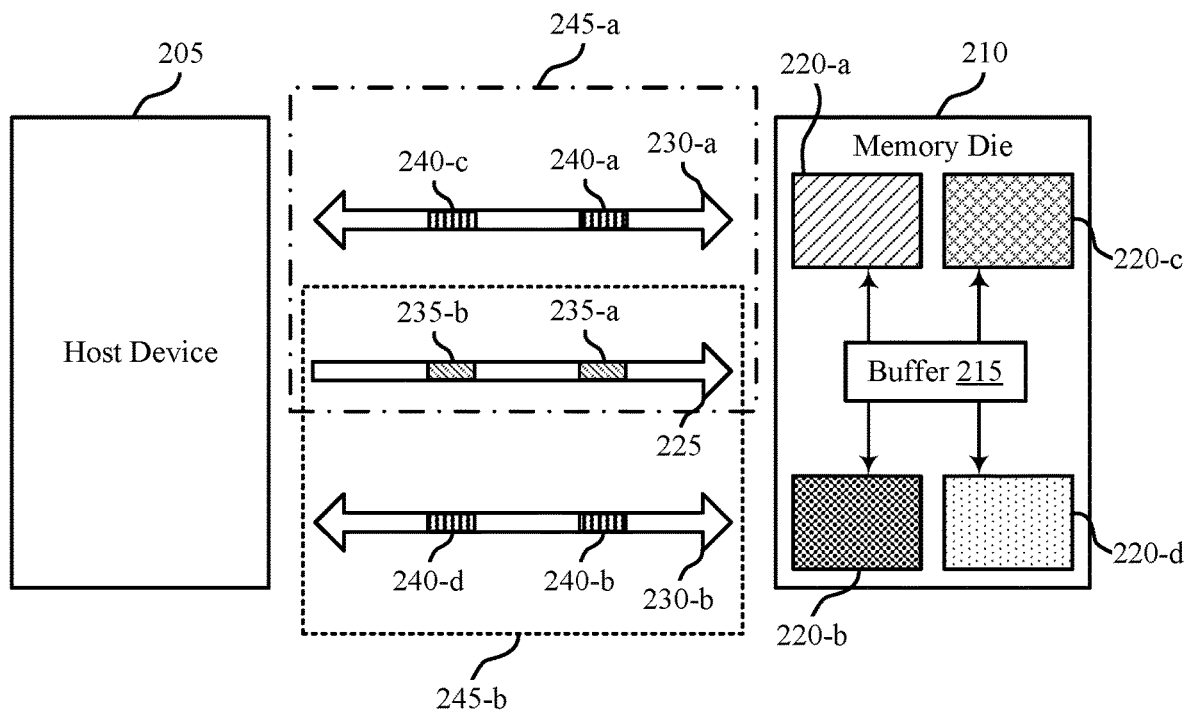

FIG. 2 illustrates an example of a system 200 that supports techniques for four cycle access commands in accordance with examples as disclosed herein. The system 200 may implement or be implemented by aspects of the system 100 described with reference to FIG. 1. For example, the system 200 may include a host device 205 and a memory die 210, which may be examples of the corresponding devices described with reference to FIG. 1. The system 200 may support the communication of access commands that are associated with multiple pseudo-channels, which may provide improvements to latency, data rates, decoding complexity, and resource utilization efficiency, among other benefits.

The memory die 210 may include a set of memory arrays (e.g., memory arrays 170) or banks. In some examples, the memory arrays or banks may be organized into different portions 220. For example, the memory die 210 may include a portion 220-a, a portion 220-b, a portion 220-c, and a portion 220-d, each of which may include one or more memory arrays or banks. In some examples, each portion 220 may correspond to a different bank group of the memory die 210.

The memory die 210 may also include a buffer 215 that is operable to buffer commands received from the host device 205. For example, the buffer 215 may buffer access commands 235 received from the host device 205 and issue the access commands 235 to corresponding portions 220 in accordance with timing parameters of the memory die 210.

The host device 205 and the memory die 210 may communicate information over one or more channels. For example, the host device 205 may transmit access commands 235 to the memory die 210 over a CA channel 225, which may be an example of a CA channel 186 described with reference to FIG. 1. The host device 205 and the memory die 210 may also communicate data 240 over DQ channels 230, which may be examples of a DQ channel 190 described with reference to FIG. 1. For example, the host device 205 and the memory die 210 may communicate data 240 over a DQ channel 230-*a* and over a DQ channel 230-*b*. In some examples, the DQ channel 230-*a* and the DQ channel 230-*b* may be associated with respective portions 220 of the memory die 210. For example, the memory die 210 may be configured to communicate data 240 to and from the portion 220-*a* and the portion 220-*c* over the DQ channel 230-*a* and configured to communicate data 240 to and from the portion 220-*b* and the portion 220-*d* over the DQ channel 230-*d*.

In some examples, communications between the host device 205 and the memory die 210 to the various portions 220 may be (e.g., logically) divided (e.g., organized, separated) between pseudo-channels 245. For example, the portion 220-*a* and the portion 220-*c* may be associated with a pseudo-channel 245-*a*, and the portion 220-*b* and the portion 220-*d* may be associated with a pseudo-channel 245-*b*. The pseudo-channels 245 may each be associated with the CA channel 225. For example, the memory die 210 may have a common command interface such that an access command 235 for accessing any of the portions 220 may be received over the CA channel 225. The DQ channel 230 used to communicate the data in accordance with the access command 235, however, may be based on the particular portion 220 that is accessed. For example, the DQ channel 230-*a* may be used if the portion 220-*a* or the portion 220-*c* are accessed, and the DQ channel 230-*b* may be used if the portion 220-*b* or the portion 220-*d* are accessed. Accordingly, the pseudo-channel 245-*a* and the pseudo-channel 245-*b* may each include the CA channel 225 but include different DQ channels 230; the pseudo-channel 245-*a* including the DQ channel 230-*a*, and the pseudo-channel 245-*b* including the DQ channel 230-*b*.

In some examples, one or more other channels may be included in the pseudo-channels 245. For example, a common clock signal channel (e.g., a clock signal channel 188) or common other channels (e.g., other channels 192, EDC channels) between the host device 205 and the memory die 210 may be included in the pseudo-channels 245. In some cases, the other channels may be excluded from the pseudo-channels 245.

In some cases, the host device 205 and the memory die 210 may communicate over more than two pseudo-channels 245. For example, the host device 205 and the memory die 210 may communicate over a respective pseudo-channel 245 for each DQ channel 230 used to communicate data 240 between the host device 205 and the memory die 210. Each respective pseudo-channel 245 may include the CA channel 225 and a corresponding DQ channel 230.

It is noted that the pseudo-channels 245 may be associated with more than one memory die 210. For example, the memory die 210 may be included in a memory device (e.g., a memory device 110) that includes multiple memory dies 210 that communicate with the host device 205 over a respective CA channel 225 and two respective DQ channels 230 (e.g., or more DQ channels 230). In some cases, an access command 235 transmitted over a pseudo-channel 245 may include a respective access command 235 transmitted to each of the memory dies 210 over the respective CA channels 225, and data 240 communicated over the pseudo-channel 245 may include respective data 240 communicated with each memory die 210 over the respective DQ channels 230.

The memory die 210 may support concurrent communication of data 240 over the DQ channel 230-*a* and the DQ channel 230-*b*. For example, the memory die 210 may receive data 240 over the DQ channel 230-*a* concurrent with receiving data 240 over the DQ channel 230-*b*. Additionally or alternatively, the memory die 210 may transmit data 240 over the DQ channel 230-*a* concurrent with transmitting data 240 over the DQ channel 230-*b*. In some examples, the memory die 210 may not support concurrent transmission of data 240 over one DQ channel 230 and reception of data 240 over the other DQ channel 230. For example, if data 240 is being transmitted (e.g., or received) over the DQ channel 230-*a*, reception (e.g., or transmission) of data 240 over the DQ channel 230-*b* may wait until the transmission of the data 240 over the DQ channel 230-*a* is completed.

In some examples, the host device 205 may transmit access commands 235 that are two cycle access commands. That is, the information of the access command 235 may be transmitted to the memory die 210 over two unit intervals, where a unit interval is an interval of time during which one symbol of information may be communicated (e.g., a symbol duration time). In some examples, a unit interval may be a single clock cycle. In some examples, a unit interval may be less than a clock cycle, such as corresponding to a rising or falling edge of a clock cycle. In some cases, a unit interval of communications over the CA channel 225 may be different from a unit interval of communications over the DQ channels 230. For example, the unit interval associated with the CA channel 225 may be a single clock cycle, and the unit interval associated with the DQ channel 230 may correspond to a clock edge. Additionally or alternatively, the CA channel 225 and DQ channel 230 unit intervals may be the same.

A two cycle access command may include an operation code indicating the type of the two cycle access command and a single target address of the memory die 210 for the two cycle access command. For example, the two cycle access command may include an address within one of the portions 220 to which data 240 is to be written or read. As such, the two cycle access command may be associated with a single pseudo-channel 245 (e.g., initiate data communication over a single DQ channel 230). Accordingly, if transmitting two cycle access commands, the host device 205 may transmit two access commands 235 in order to transmit or receive data 240 over both of the DQ channels 230. In some cases, however, such transmission of two access commands 235 may result in delays or timing offsets between respective data 240 that is transmitted over received over the DQ channels 230. A two-cycle command may refer to a command that is transmitted over the CA channel 225 for two unit intervals. A four-cycle command may refer to a command that is transmitted over the CA channel 225 for four unit intervals.

A command decoder at the memory die 210 may have timing constraints associated with decoding operation codes of access commands 235 such that two access commands 235 may not be transmitted back-to-back (e.g., without a delay between the two access commands 235). That is, the host device 205 may delay transmission of a second two cycle command associated with the DQ channel 230-*b* until after a delay after transmission of a first two cycle command associated with the DQ channel 230-*a* so that the command decoder may be able to correctly process and decode the operation code of the first two cycle command and the operation code of the second two cycle command. Delays between two cycle access commands, however, may translate to delays or timing offsets between data 240 subsequently communicated over the DQ channel 230-*a* and the DQ channel 230-*b*. For example, the communication of data 240 over the DQ channel 230-*a* may be initiated (e.g., and completed) before the communication of data 240 over the DQ channel 230-*b* is initiated (e.g., and completed) based on the first two cycle command being transmitted before the second two cycle command. Such timing offsets may result in increased delays between being able to transition between transmitting and receiving data 240 over a given DQ channel 230, for example, due to the constraint of not supporting concurrent transmission and reception of data 240 over different DQ channels 230. Additionally, in some cases, the timing offsets between data communication over the different DQ channels 230 may be such that a preamble of data 240 communicated over one DQ channel 230 collides with (e.g., at least partially overlaps in time with) a post-amble of data communicated over the other DQ channel 230, which may be referred to as an inter-amble collision. Such collisions may increase complexity of decoding the data, limit data transfer rates to compensate for the increased complexity, or both.

In accordance with examples described herein, the host device 205 may be configured to transmit an access command 235 that is associated with multiple pseudo-channels 245. For example, the host device 205 may transmit an access command 235-*a* that includes a single operation code and multiple target addresses associated with different pseudo-channels 245. In the example of FIG. 2, the access command 235-*a* may include a first target address that is associated with the pseudo-channel 245-*a* and a second target address that is associated with the pseudo-channel 245-*b*. For instance, the first target address may be an address within the portion 220-*a* and the second target address may be an address within the portion 220-*b*. The operation code of the access command 235-*a* may apply to both the first target address and the second target address, and thus the access operation indicated by the operation code may be performed at both the first target address and the second target address without a delay therebetween. For example, in accordance with the access command 235-*a*, the memory die 210 may communicate data 240-*a* between the portion 220-*a* and the host device 205 over the DQ channel 230-*a* and communicate data 240-*b* between the portion 220-*b* and the host device 205 over the DQ channel 230-*b*. The communication of the data 240-*a* and the data 240-*b* may be initiated (e.g., and completed) at a same time based on the operation code applying to both the first target address and the second target address.

To support the communication of an access command 235 including multiple target addresses, the access command 235 may be transmitted over more than two unit intervals. For example, in the example of FIG. 2, the host device 205 may transmit the access command 235-*a* over four unit intervals in order to indicate the additional target address in the access command 235-*a*, and thus the access command 235-*a* may be referred to as a four cycle command. In some examples, the access command 235-*a* may be transmitted over more than four unit intervals based on the quantity of pseudo-channels 245 over which data is to be communicated (e.g., six unit intervals for three pseudo-channels 245, eight unit intervals for four pseudo-channels 245, and so on). Additional details related to four cycle commands 235 and the information included therein are described with reference to FIG. 3 below.

In some examples, the host device 205 may transmit an additional four cycle access command (e.g., an access command 235-*b*) that may be buffered and issued together with the access command 235-*a*. For example, the host device 205 may transmit the access command 235-*b* including a single operation code that indicates a same type of access command as the access command 235-*b*, a third target address within the portion 220-*c*, and a fourth target address within the portion 220-*d*. In some examples, the buffer 215 may buffer the access command 235-*a* and the access command 235-*b* and issue the access commands 235 to the corresponding addresses over a same range of unit intervals. In response, the memory die 210 and the host device 205 may communicate the data 240-*a*, the data 240-*b*, data 240-*c* between the portion 220-*c* and the host device 205 over the DQ channel 230-*a*, and data 240-*d* between the portion 220-*d* and the host device 205 over the DQ channel 230-*b*. Additional details related to buffering and issuing multiple four cycle access commands are described with reference to FIG. 5 below.

FIG. 3 illustrates an example of a command diagram 300 that supports techniques for four cycle access commands in accordance with examples as disclosed herein. The command diagram 300 may be implemented by aspects of the systems 100 and 200 described with reference to FIGS. 1 and 2, respectively. For example, the command diagram 300 depicts a command truth table 305 that may be implemented by a host device and memory die, described with reference to FIGS. 1 and 2, to support the communication of access commands associated with multiple pseudo-channels (e.g., four cycle access commands).

The command truth table 305 may include information that indicates formatting for various access commands 310 such that a memory die may be able to properly decode and perform access commands transmitted by a host device. For example, the command truth table 305 may include a "Function" column that indicates the type of access command to which the associated information of the command truth table 305 corresponds. For instance, in the example of FIG. 3, the command truth table 305 may include an access command having a type A1. Examples of types of access commands include write commands, read commands, write with auto precharge commands, read with auto precharge commands, among other types of column commands.

The command truth table 305 may also include a "CS_n" column that indicates a cycle of the access command 310 to which the associated row of information corresponds. For example, the access command 310 may be an example of a four cycle command that is transmitted over four unit intervals of a CA channel. That is, a first subset of bits of the access command 310 may be transmitted over a first unit interval (e.g., first cycle), a second subset of bits of the access command 310 may be transmitted over a second unit interval (e.g., second cycle), a third subset of bits of the access command 310 may be transmitted over a third unit interval (e.g., third cycle), and a fourth subset of bits of the access command 310 may be transmitted over a fourth unit interval (e.g., fourth cycle). In the example of FIG. 3, the four unit intervals may be indicated by alternating low and high cycles. For example, the first unit interval may correspond to a first low cycle L1, the second unit interval may correspond to a first high cycle H1, the third unit interval may correspond to a second low cycle L2, and the fourth unit interval may correspond to a second high cycle H2.

The command truth table 305 may also indicate the bits that are communicated over each CA pin of a CA channel during each unit interval of the access command 310. For example, a CA channel may include fourteen conductive lines coupled with fourteen CA pins (e.g., CA pin CA0 through CA13) at each of the host device and the memory die. Each CA pin column may indicate the respective bits that are transmitted over the CA pin during each unit interval. For example, the CA0 pin column indicates that the bits "OP1", "V", "V", and "V" are transmitted over the CA0 pin during the L1, H1, L2, and H2 cycles respectively.

The command truth table 305 includes an example bit configuration (e.g., bit format) of the access command 310 such that the access command 310 may include a single operation code and two target addresses of the memory die as described herein. In the example of FIG. 3, the operation code of the access command 310 may be transmitted over CA0 through CA4 during the L1 cycle. For example, OP1, OP2, OP3, OP4, and OP5 bits, which together may represent the operation code of the access command 310, may be transmitted over CA0, CA1 CA2, CA3, and CA4, respectively. The bit combination of the OP bits may indicate the type A1 of the access command 310. For example, each of the OP bits may be high ("H") or low ("L"), and the combination of the H and L states may indicate the type A1. For instance, a bit combination of HLHHL may indicate that the access command 310 is a write command, and a bit combination of HLHHH may indicate that the access command is a read command.

During the L1 cycle, the CA5 pin may carry a BL bit that indicates a burst mode of the memory die. For example, if the BL bit is L (e.g., BL*=L), the access command 310 may place the memory die into an alternate burst mode described instead of a default burst length 16 mode. Bank related address information for a first target address of the access command 310 may be transmitted over the CA6 through CA10 pins during the L1 cycle. For example, BA0 and BA1 bits transmitted over CA6 and C7 may indicate a bank address of the first target address, and BG0, BG1, and BG2 transmitted over CA8, CA9, and CA10 may indicate a bank group of the first target address.

One or more bits of the access command 310 may indicate that the access command 310 is a four cycle command. For example, a CY bit transmitted over the CA11 pin during the L1 cycle may indicate that the access command 310 is a four cycle command. This may indicate to the memory die that the operation code indicated by the OP1 through OP5 bits applies to both the first target address and a second target address indicated by the access command 310 over the four unit intervals. The CA11 pin may correspond to a twelfth bit of the access command 310 received over a given unit interval. Accordingly, the CY bit indicating that the access command 310 is a four cycle command may be the twelfth bit of access command 310 received over the first unit interval.

CID bits may be chip identifier (ID) bits that are used for three-dimensional stacking support. If unused, the CID bits may be valid V bits, which may be either high or low. V bits may correspond to reserved bits, which may be reserved for future use and development. During the L1 cycle, CID0 and CID2 bits associated with the first target address may be transmitted over the CA12 and CA13 pins.

A remainder of the first target address may be transmitted over the H1 cycle (e.g., the second unit interval). For example, during the H1 cycle, column address bits C3, C4, C5, C6, C7, C8, C9, and C10 may be transmitted over the CA0 through CA8 pins, respectively. The column address bits C may indicate the column address of the first target address, which in combination with the bank address bits, may indicate the first target address. Valid or reserved bits V may be transmitted over the CA0, CA9, and CA11 pins. In some examples, if the access command 310 is a write command, the CA11 bit may indicate whether the write command is a partial write command (e.g., if WR_partial=L, the write command is a partial write command). A bit indicative of whether the access command 310 is performed with auto-precharge may be transmitted over the CA10 pin. For example, if is a high H bit, the command may be performed without auto-precharge. CID1 and CID3 bits associated with the first target address may be transmitted over the CA12 and CA13 pins during the H1 cycle.

The second target address may be transmitted over the L2 and the H2 cycles (e.g., over the third and fourth unit intervals) of the access command 310. For example, bank address and bank group information of the second target address may be transmitted over the CA6 through CA10 pins during the L2 cycle. Additionally, column address information of the second target address may be transmitted over the CA1 through CA8 pins during the H2 cycle.

If the L2 and H2 cycles corresponded to low and high cycles of a second two cycle access command rather than corresponding to the third and fourth cycles of a four cycle command, the bits received over the CA0 through CA4 pins would indicate an operation code of the second two cycle access command. However, because the operation code of the access command 310 applies to both the first target address and the second target address (e.g., as indicated by the CY bit), these bits may instead be reserved. For example, bits communicated over the CA0 through CA4 pins during the L2 cycle may be reserved V bits rather than OP bits based on the access command 310 being a four cycle command. In other words, the conductive lines of the CA channel used to communicate the operation code during the L1 cycle may be used to communicate reserved bits during the L2 cycle.

In some examples, the bit transmitted over the CA1 pin during the L2 cycle may a CY bit to indicate that the access command 310 is a four cycle command. For example, the CY bit during the L2 cycle may be transmitted in addition to or instead of the CY bit transmitted during the L1 cycle. In some examples, the CY bit of the L1 or L2 cycle may instead be a reserved V bit, for example, if the CY bit is transmitted in the other L cycle. In some examples, reserved V bits may be transmitted over the CA0, CA9, CA10, and CA11 bits during the H2 cycle. In some examples, CID bits associated with the second target address may be transmitted over the CA12 and CA13 pins during the L2 and H2 cycles. One or more CY bits may be positioned at any bit location in the four-cycle command. In such examples, bit locations of other types of information may also be adjusted, relative to the example shown in FIG. 3.

In response to receiving the access command 310 from the host device, the memory die may decode the access command 310 in accordance with the command truth table 305 to determine the type A1, the first target address, and the second target address. In accordance with the determined type and addresses, the memory die may communicate data with the host device to or from the first target address over a first DQ channel associated with a first pseudo-channel and to or from the second target address over a second DQ channel associated with a second pseudo-channel.

Figure 4:
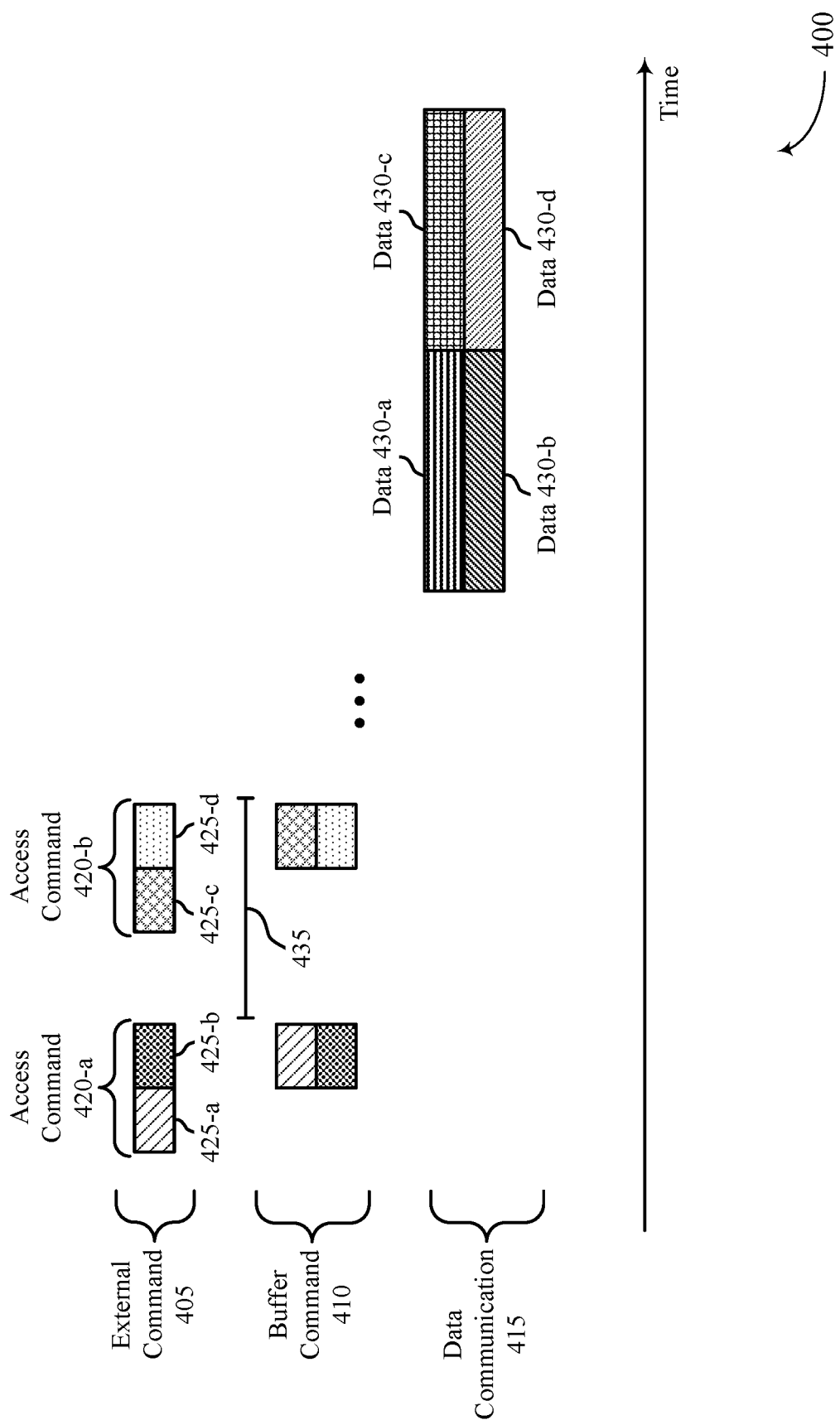
FIGS. 4 and 5 illustrate examples of communication sequences that support techniques for four cycle access commands in accordance with examples as disclosed herein.

FIG. 4 illustrates an example of a communication sequence 400 that supports techniques for four cycle access commands in accordance with examples as disclosed herein. The communication sequence 400 may be implemented by aspects of the systems 100 and 200 described with reference to FIGS. 1 and 2, respectively. For example, the communication sequence 400 may be implemented by a host device and memory die, described with reference to FIGS. 1 through 3, to support the communication of access commands associated with multiple pseudo-channels (e.g., four cycle access commands).

The communication sequence 400 illustrates different operations performed by the memory die and the host device in association with a four cycle access command. For example, the communication sequence 400 may include an external command operation 405 that corresponds to the transmission of one or more access commands 420 from the host device to the memory die. The communication sequence 400 may also include a buffer command operation 410 that corresponds to a buffering of the one or more access commands 420 by the memory die. The communication sequence 400 may also include a data communication operation 415 that corresponds to a communication of data 430 between the host device and the memory die in accordance with the one or more access commands 420.

For example, the host device may transmit an access command 420-a to the memory die over a CA channel. The access command 420-a may be a four cycle access command associated with communicating data 430 over two pseudo-channels over which the host device and the memory die communicate. For example, the access command 420-a may include a target address 425-a and a target address 425-b. The target address 425-a may be within a first portion of the memory die corresponding to a first pseudo-channel, and the target address 425-b may be within a second portion of the memory die corresponding to a second pseudo-channel. The access command 420-a may include a single operation code that applies to both the target address 425-a and the target address 425-b. For example, the access command 420-a may include one or more bits (e.g., CY bits) that indicate that the type of access operation indicated by the operation code is to be performed at both the target address 425-a and the target address 425-b.

Based on receiving the access command 420-a, the memory die may buffer the access command 420-a (e.g., using a buffer 215). For example, the memory die may decode the access command 420-a to determine the target address 425-a and the target address 425-b. Based on the access command 420-a being a four cycle command, the memory die may buffer the access command 420-a such that the access command 420-a may be issued to the target address 425-a and the target address 425-b over a same range of unit intervals (e.g., at a same time, over a same two unit intervals). That is, due to determining the target address 425-a and the target address 425-b based on a same access command 420, the memory die may issue the access command 420-a to the target address 425-a and the target address 425-b over the same range of unit intervals (e.g., rather than with a delay therebetween corresponding to the delay between two different two cycle commands).

At some time after receiving and issuing the access command 420-a, the memory die and the host device may communicate respective data 430 over the first pseudo-channel and the second pseudo-channel in accordance with the access command 420-a. For example, if the access command 420-a is a read command, the memory die may transmit data 430-a from the target address 425-a to the host device over the first pseudo-channel and transmit data 430-b from the target address 425-b to the host device over the second pseudo-channel. Alternatively, if the access command 420-a is a write command, the memory die may receive and write the data 430-a to the target address 425-a and receive and write the data 430-b to the target address 425-b. The communication of the data 430-a and the data 430-b over the pseudo-channels may be initiated at a same time based on issuing the access command 420-a over the same range of unit intervals. That is, there may be no timing offset between initiating the communication of the data 430-a and the data 430-b. In some examples, the communication of the data 430-a and the data 430-b may also be completed at a same time, for example, if the data 430-a and the data 430-b include a same quantity of information. Here, there may be no timing offset between completing the communication of the data 430-a and the data 430-b.

In some examples, the host device may transmit one or more additional four cycle access command to the memory die, for example, that is associated with communicating data 430 to same or different bank groups of the memory die within the first portion and the second portion. For example, the host device may transmit an access command 420-b to the memory die that includes a target address 425-c and a target address 425-d. The target address 425-c may be located within the first portion and correspond to a bank group that is the same as or different from a bank group corresponding to the target address 425-a. The target address 425-d may be located within the second portion and correspond to a bank group that is the same as or different from a bank group corresponding to the target address 425-b.

In some examples, the host device may transmit the access command 420-b in accordance with a duration 435. For example, the duration 435 may be a quantity of unit intervals between which successive access commands of the same type may be transmitted (e.g., a tCCD duration, such as a tCCD_S duration of approximately 2 nanoseconds or a tCCD_L of approximately 5 nanoseconds). Accordingly, the host device may transmit the access command 420-b at a time after transmitting the access command 420-a such that the access command 420-b is received in accordance with the duration 435.

The memory die may decode the access command 420-b to determine the target address 425-c and the target address 425-d. The memory die may buffer the access command 420-b and issue the access command 420-b to the target address 425-c and the target address 425-d during a same range of unit intervals. At some time after receiving and issuing the access command 420-b, the memory die and the host device may communicate respective data 430 over the first pseudo-channel and the second pseudo-channel in accordance with the access command 420-b. For example, the memory die and the host device may communicate data 430-c to or from the target address 425-c over the first pseudo-channel and may communicate data 430-d to or from the target address 425-d over the second pseudo-channel. The memory die and the host device may communicate the data 430-c and the data 430-d after the communication of the data 430-a and the data 430-b, respectively. In some examples, the communication of the data 430-c and the data 430-d may be initiated (e.g., and completed) at a same time.

Figure 5:
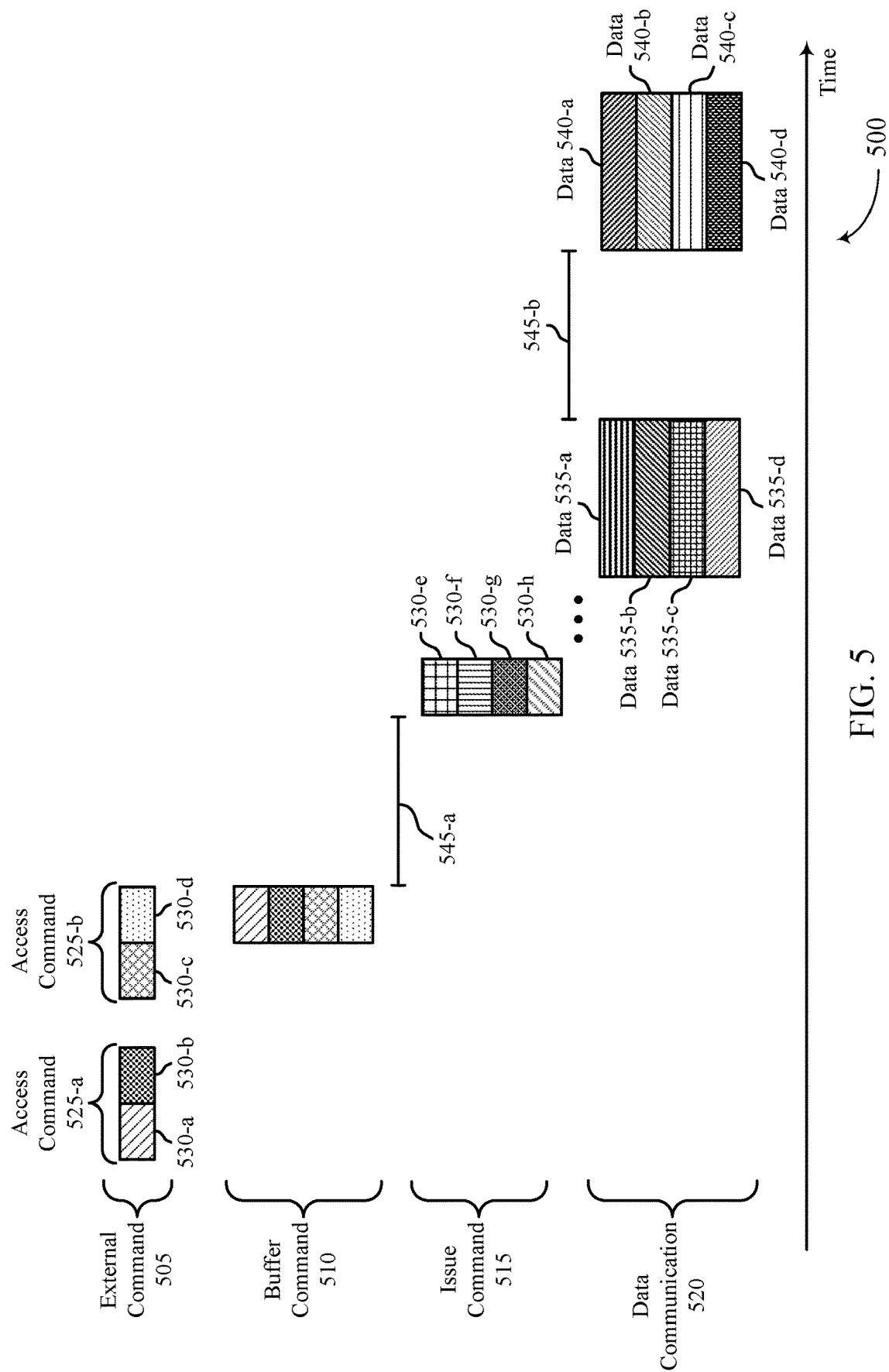

FIG. 5 illustrates an example of a communication sequence 500 that supports techniques for four cycle access commands in accordance with examples as disclosed herein. The communication sequence 500 may be implemented by aspects of the systems 100 and 200 described with reference to FIGS. 1 and 2, respectively. For example, the communication sequence 500 may be implemented by a host device and memory die, described with reference to FIGS. 1 through 3, to support the communication of access commands associated with multiple pseudo-channels (e.g., four cycle access commands).

The communication sequence 500 illustrates different operations performed by the memory die and the host device in association with a four cycle access command. For example, the communication sequence 500 may include an external command operation 505 that corresponds to the transmission of one or more access commands 525 from the host device to the memory die. The communication sequence 500 may also include a buffer command operation 510 that corresponds to a buffering and issuing of the one or more access commands 525 by the memory die. The communication sequence 500 may additionally include an issue command operation 515 that corresponds to an issuing of one or more internally generated access commands to respective portions of the memory die that are based on portions of the memory die indicated by the one or more access commands 525. The communication sequence 500 may also include a data communication operation 520 that corresponds to a communication of data 535 between the host device and the memory die in accordance with the one or more access commands 525 (e.g., and the one or more internally generated access commands).

In some examples, the communication sequence 500 may correspond to an example communication sequence in which two four cycle access commands may be buffered and issued together based on a quantity of conductive lines included in DQ channels between the memory die and the host device. For example, the greater quantity of conductive lines and corresponding DQ pins of DQ channels between the memory die and the host device, the greater quantity of data bits that may be communicated per unit interval. In the example of FIG. 5, the memory die and the host device may be configured to communicate over a first pseudo-channel associated with a first portion of the memory die and a second pseudo-channel associated with a second portion of the memory die. A first DQ channel associated with the first pseudo-channel and a second DQ channel associated with the second pseudo-channel may include a quantity of conductive lines (e.g., be x16 DQ channels that include 16 conductive lines) such that concurrent access to multiple addresses (e.g., two addresses) of the first portion and the second portion may be supported. For example, first data 535 may be communicated to or from a first target address of the first portion over a first subset of conductive lines of the first DQ channel and second data 535 may be communicated to or from a second target address of the first portion over a second subset of conductive lines the first DQ channel. As such, the first pseudo-channel and the second pseudo-channel may together support concurrent same type access of four target addresses, two target addresses per pseudo-channel.

For example, the host device may transmit an access command 525-*a* to the memory die over a CA channel, which may be an example of a four cycle command. The access command 525-*a* may include a target address 530-*a* and a target address 530-*b*. The target address 530-*a* may be within the first portion of the memory die, and the target address 530-*b* may be within the second portion of the memory die. The memory die may buffer the access command 525-*a*. The host device may transmit an access command 525-*b* to the memory die over the CA channel, which may include a target address 530-*c* and a target address 530-*d*. The target address 530-*c* may be within the first portion of the memory die, and the target address 530-*d* may be within the second portion of the memory die. The host device may transmit the access command 525-*b* in accordance with a duration between which successive access commands of the same type may be transmitted (e.g., a duration 435, a duration less than a tCCD_S duration such as 0.75*tCCD_S/2).

If the memory die has not yet issued the access command 525-*a* to the target address 530-*a* and the target address 530-*b* before the access command 525-*b* is received from the host device, the memory die may buffer the access command 525-*a* together with the access command 525-*b*. For example, based on supporting concurrent access to two target addresses in each portion of the memory die, the memory die may buffer the access command 525-*a* and the access command 525-*b* such that the access command 525-*a* and the access command 525-*b* may be issued together. For example, the memory die may issue the access command 525-*a* to the target address 530-*a* and the target address 530-*b* over a same range of unit intervals (e.g., a same two unit intervals) based on the access command 525-*a* being a four cycle command. Additionally, the memory die may issue the access command 525-*b* to the target address 530-*c* and the target address 530-*d* over the same range of unit intervals (e.g., the same two unit intervals) as the access command 525-*a* based on buffering the access command 525-*a* together with the access command 525-*b*.

Based on issuing the access command 525-*a* and the access command 525-*b* over the same range of unit intervals, the memory die and the host device may concurrently communicate respective data 535 to or from corresponding target addresses 530. For example, the memory die and the host device may concurrently communicate data 535-*a* to or from the target address 530-*a* over a first subset of conductive lines of the first DQ channel, data 535-*b* to or from the target address 530-*b* over a first subset of conductive lines of the second DQ channel, data 535-*c* to or from the target address 530-*c* over a second subset of conductive lines of the first DQ channel, and data 535-*d* to or from the target address 530-*d* over a second subset of conductive lines of the second DQ channel. Additionally, initiation (e.g., and completion) of the communication of each of the data 535-*a*, 535-*b*, 535-*c*, and 535-*d* may be at a same time.

In some examples, the memory die may be configured with address offsets such that additional target addresses 530 may be indicated and accessed in response to the access commands 525. For example, the memory die may be configured with an address offset such that a column address of the memory die indicated by the target address 530-*a*, for example, may be used to generate a second column address for accessing. For instance, the memory die may include a quantity of column addresses and the address offset may correspond half the quantity of column addresses. The target address 530-*a* may include a first column address in a first half of the quantity columns, and the address offset may be added to first column address to determine a second column address in a second half of the quantity of columns. For example, if the memory die includes 64 column addresses (e.g., associated with the first pseudo-channel) and the first column address corresponds to a column address 6, an address offset of 32 (e.g., half of 64) may be added to the first column address to determine that the second column address corresponds to a column address 38.

In this way, the memory die may generate additional target addresses 530 from the target addresses 530-*a*, 530-*b*, 530-*c*, and 530-*d* indicated by the access commands 525. For example, the memory die may generate a target address 530-*e* from the target address 530-*a* and the address offset, a target address 530-*f* from the target address 530-*b* and the address offset, a target address 530-*f* from the target address 530-*c* and the address offset, and a target address 530-*g* from the target address 530-*d* and the address offset. The target addresses 530-*e* and 530-*g* may be within the first portion of the memory die (e.g., associated with the first pseudo-channel), and the target addresses 530-f and 530-h may be within the second portion of the memory die (e.g., associated with the second pseudo-channel).

The memory die may generate and issue internal access commands associated with the additional target addresses 530 in accordance with a duration 545, which may correspond to a tCCD_L duration. For example, the memory die may generate internal access commands of the same type as the access commands 525 that include the target addresses 530-e, 530-f, 530-h, and 530-h. The memory die may issue the internal access commands (e.g., over a same range of unit intervals) to the respective additional target addresses 530 after a duration 545-a from issuance of the access commands 525 to the target addresses 530-a, 530-b, 530-c, and 530-d. In response to the internal access commands, the memory die and the host device may concurrently communicate respective data 540 to or from corresponding target addresses 530. For example, the memory die and the host device may concurrently communicate data 540-a to or from the target address 530-e over the first (e.g., or second) subset of conductive lines of the first DQ channel, data 540-b to or from the target address 530-f over the first (e.g., or second) subset of conductive lines of the second DQ channel, data 540-c to or from the target address 530-g over the second (e.g., or first) subset of conductive lines of the first DQ channel, and data 540-d to or from the target address 530-h over the second (e.g., or first) subset of conductive lines of the second DQ channel. Additionally, initiation (e.g., and completion) of the communication of each of the data 540-a, 540-b, 540-c, and 540-d may be at a same time. The initiation of the communication of the respective data 540 may be after a duration 545-b after the data 535 is communicated, for example, based on issuing the internal commands after the duration 545-a from the issuance of the access commands 525.

By buffering and issuing multiple four cycle commands together (e.g., and generating and issuing additional internal access commands), latency may further be reduced, data rates may further be increased, a resource utilization efficiency may further be increased, among other benefits.

Figure 6:
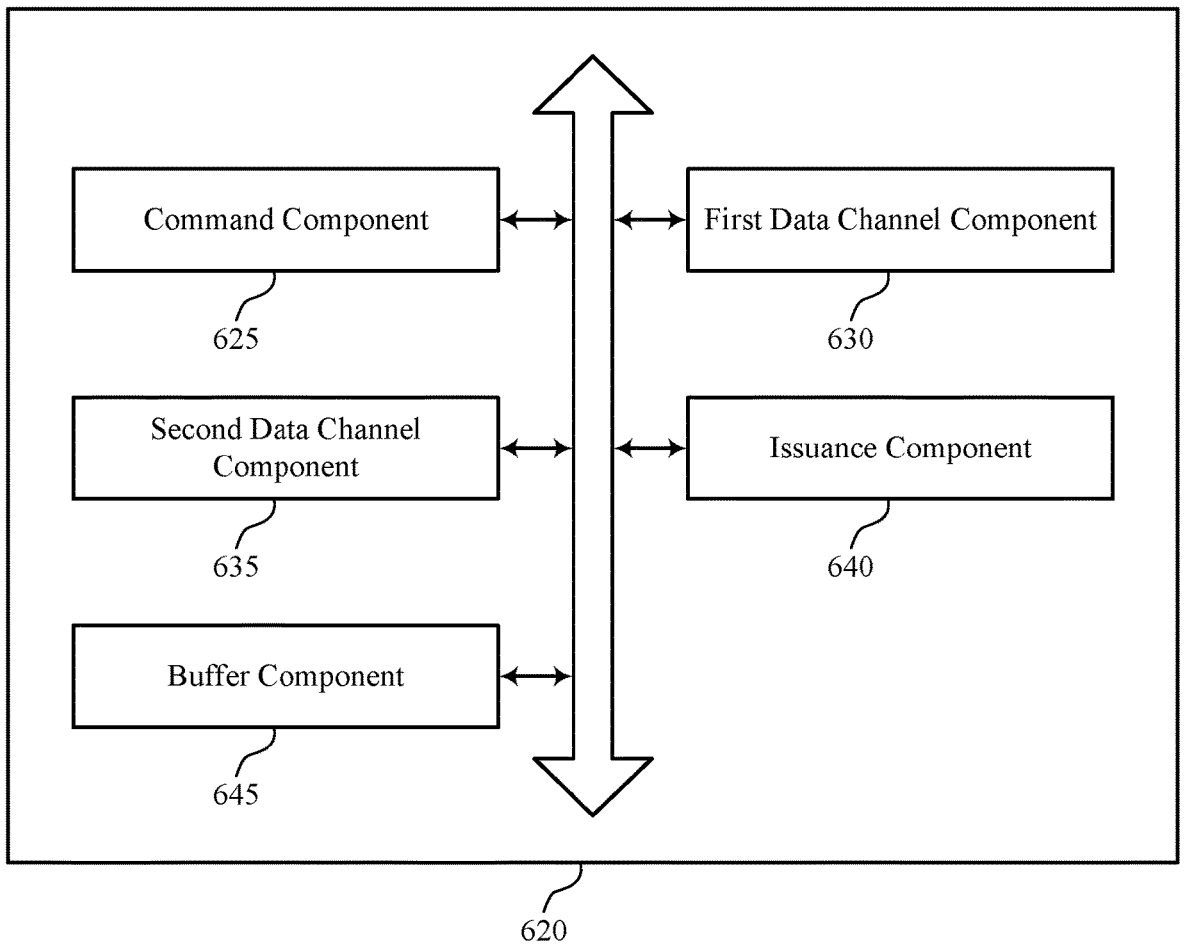
FIG. 6 shows a block diagram of a memory device that supports techniques for four cycle access commands in accordance with examples as disclosed herein.

FIG. 6 shows a block diagram 600 of a memory device 620 that supports techniques for four cycle access commands in accordance with examples as disclosed herein. The memory device 620 may be an example of aspects of a memory device as described with reference to FIGS. 1 through 5. The memory device 620, or various components thereof, may be an example of means for performing various aspects of techniques for four cycle access commands as described herein. For example, the memory device 620 may include a command component 625, a first data channel component 630, a second data channel component 635, an issuance component 640, a buffer component 645, or any combination thereof. Each of these components may communicate, directly or indirectly, with one another (e.g., via one or more buses).

The command component 625 may be configured as or otherwise support a means for receiving, over a CA channel associated with a plurality of data channels, an access command including an operation code that indicates a type of the access command, a first address of a memory die targeted by the type of the access command, and a second address of the memory die targeted by the type of the access command. The first data channel component 630 may be configured as or otherwise support a means for communicating, in accordance with the access command, first data corresponding to the first address over a first data channel of the plurality of data channels. The second data channel component 635 may be configured as or otherwise support a means for communicating, in accordance with the access command, second data corresponding to the second address over a second data channel of the plurality of data channels.

In some examples, the command component 625 may be configured as or otherwise support a means for receiving one or more bits indicating as part of the access command indicating that the operation code applies to both the first address and the second address.

In some examples, the access command is received over four unit intervals associated with the CA channel.

In some examples, the operation code is received over a first unit interval of the four unit intervals, at least a portion of the first address is received over a second unit interval of the four unit intervals, and at least a portion of the second address is received over a third unit interval of the four unit intervals.

In some examples, the access command includes a set of reserve bits communicated in the third unit interval of the four unit intervals. In some examples, the third unit interval is after the first unit interval and the second unit interval and is before a fourth unit interval of the four unit intervals. In some examples, at least one conductive line used to communicate at least one bit of the set of reserve bits during the third unit interval is used to communicate the operation code during the first unit interval.

In some examples, a twelfth bit of the access command received over a unit interval of the access command indicates that the operation code applies to both the first address and the second address.

In some examples, the issuance component 640 may be configured as or otherwise support a means for issuing the access command to a first portion of the memory die including the first address and to a second portion of the memory die including the second address over a same range of unit intervals.

In some examples, the command component 625 may be configured as or otherwise support a means for receiving, over the CA channel, a second access command including a second operation code that indicates a type of the second access command, a third address of the memory die targeted by the type of the second access command, and a fourth address of the memory die targeted by the type of the access command. In some examples, the first data channel component 630 may be configured as or otherwise support a means for communicating, in accordance with the second access command, third data corresponding to the third address over the first data channel. In some examples, the second data channel component 635 may be configured as or otherwise support a means for communicating, in accordance with the second access command, fourth data corresponding to the fourth address over the second data channel.

In some examples, the buffer component 645 may be configured as or otherwise support a means for buffering the access command and the second access command. In some examples, the issuance component 640 may be configured as or otherwise support a means for issuing the access command and the second access command to respective portions of the memory die over a same range of unit intervals.

In some examples, the issuance component 640 may be configured as or otherwise support a means for issuing the access command to a first portion of the memory die including the first address and to a second portion of the memory die including the second address over the same range of unit intervals. In some examples, the issuance component 640 may be configured as or otherwise support a means for issuing the second access command to a third portion of the memory die including the third address and to a fourth portion of the memory die including the fourth address over the same range of unit intervals. In some examples, the same range of unit intervals is a same two unit intervals.

In some examples, a first pseudo-channel of the memory die includes the first data channel and the CA channel. In some examples, a second pseudo-channel of the memory die includes the second data channel and the CA channel.

In some examples, communication of the first data over the first data channel and communication of the second data over the second data channel are initiated at a same time based at least in part on the operation code applying to both the first address and the second address.

Figure 7:
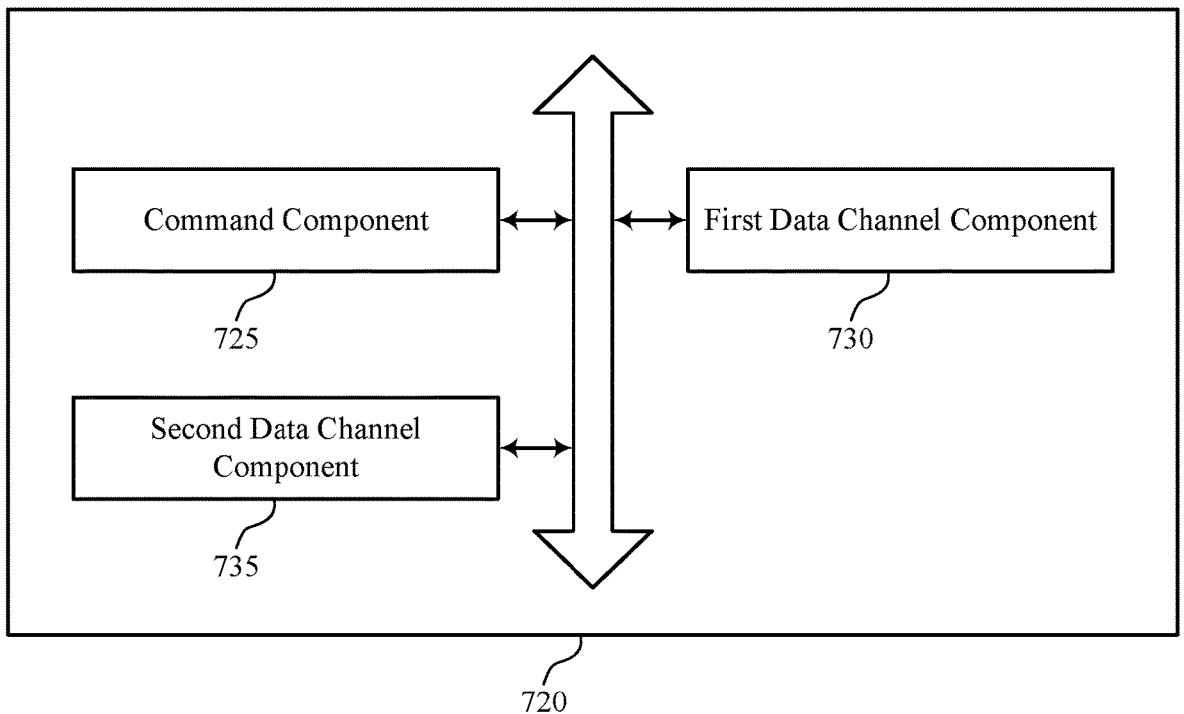
FIG. 7 shows a block diagram of a host device that supports techniques for four cycle access commands in accordance with examples as disclosed herein.

FIG. 7 shows a block diagram 700 of a host device 720 that supports techniques for four cycle access commands in accordance with examples as disclosed herein. The host device 720 may be an example of aspects of a host device as described with reference to FIGS. 1 through 5. The host device 720, or various components thereof, may be an example of means for performing various aspects of techniques for four cycle access commands as described herein. For example, the host device 720 may include a command component 725, a first data channel component 730, a second data channel component 735, or any combination thereof. Each of these components may communicate, directly or indirectly, with one another (e.g., via one or more buses).

The command component 725 may be configured as or otherwise support a means for transmitting, over a CA channel associated with a plurality of data channels, an access command including an operation code that indicates a type of the access command, a first address of a memory die targeted by the type of the access command, and a second address of the memory die targeted by the type of the access command. The first data channel component 730 may be configured as or otherwise support a means for communicating, in accordance with the access command, first data corresponding to the first address over a first data channel of the plurality of data channels. The second data channel component 735 may be configured as or otherwise support a means for communicating, in accordance with the access command, second data corresponding to the second address over a second data channel of the plurality of data channels.

In some examples, the command component 725 may be configured as or otherwise support a means for transmitting one or more bits as part of the access command indicating that the operation code applies to both the first address and the second address.

In some examples, the access command is transmitted over four unit intervals associated with the CA channel.

In some examples, the operation code is transmitted over a first unit interval of the four unit intervals, at least a portion of the first address is transmitted over a second unit interval of the four unit intervals, and at least a portion of the second address is transmitted over a third unit interval of the four unit intervals.

In some examples, the access command includes a set of reserve bits communicated in the third unit interval of the four unit intervals. In some examples, the third unit interval is after the first unit interval and the second unit interval and is before a fourth unit interval of the four unit intervals. In some examples, at least one conductive line used to communicate at least one bit of the set of reserve bits during the third unit interval is used to communicate the operation code during the first unit interval.

In some examples, a twelfth bit of the access command transmitted over a unit interval of the access command indicates that the operation code applies to both the first address and the second address.

In some examples, the command component 725 may be configured as or otherwise support a means for transmitting, over the CA channel, a second access command including a second operation code that indicates a type of the second access command, a third address of the memory die targeted by the type of the second access command, and a fourth address of the memory die targeted by the type of the access command. In some examples, the first data channel component 730 may be configured as or otherwise support a means for communicating, in accordance with the second access command, third data corresponding to the third address over the first data channel. In some examples, the second data channel component 735 may be configured as or otherwise support a means for communicating, in accordance with the second access command, fourth data corresponding to the fourth address over the second data channel.

In some examples, a first pseudo-channel of the memory die includes the first data channel and the CA channel. In some examples, a second pseudo-channel of the memory die includes the second data channel and the CA channel.

In some examples, communication of the first data over the first data channel and communication of the second data over the second data channel are initiated at a same time based at least in part on the operation code applying to both the first address and the second address.

Figure 8:
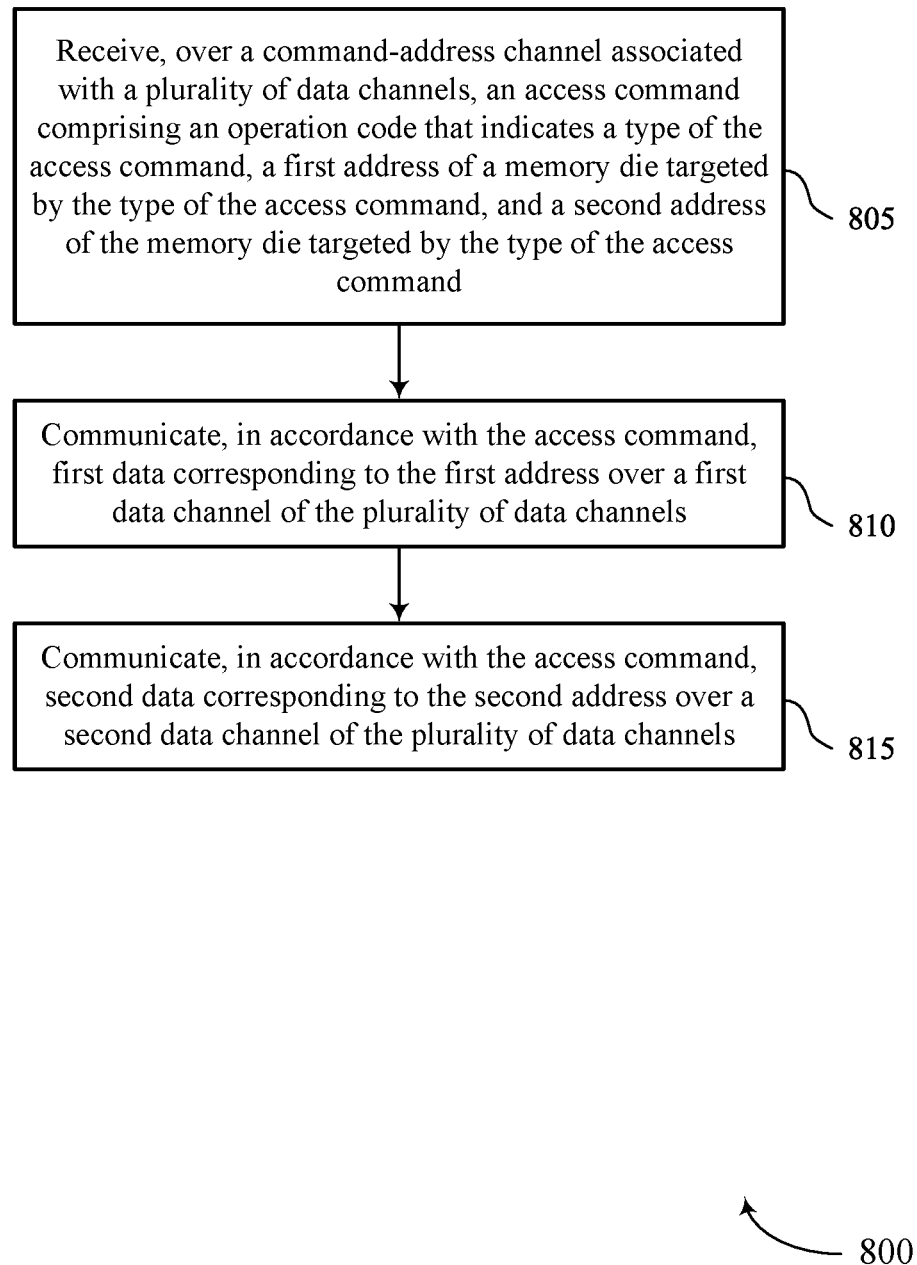
FIGS. 8 and 9 show flowcharts illustrating a method or methods that support techniques for four cycle access commands in accordance with examples as disclosed herein.

FIG. 8 shows a flowchart illustrating a method 800 that supports techniques for four cycle access commands in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 805, the method may include receiving, over a CA channel associated with a plurality of data channels, an access command including an operation code that indicates a type of the access command, a first address of a memory die targeted by the type of the access command, and a second address of the memory die targeted by the type of the access command. The operations of 805 may be performed in accordance with examples as disclosed with reference to FIGS. 2 through 5. In some examples, aspects of the operations of 805 may be performed by a command component 625 as described with reference to FIG. 6.

At 810, the method may include communicating, in accordance with the access command, first data corresponding to the first address over a first data channel of the plurality of data channels. The operations of 810 may be performed in accordance with examples as disclosed with reference to FIGS. 2, 4, and 5. In some examples, aspects of the operations of 810 may be performed by a first data channel component 630 as described with reference to FIG. 6.

At 815, the method may include communicating, in accordance with the access command, second data corresponding to the second address over a second data channel of the plurality of data channels. The operations of 815 may be performed in accordance with examples as disclosed with reference to FIGS. 2, 4, and 5. In some examples, aspects of the operations of 815 may be performed by a second data channel component 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, over a CA channel associated with a plurality of data channels, an access command including an operation code that indicates a type of the access command, a first address of a memory die targeted by the type of the access command, and a second address of the memory die targeted by the type of the access command; communicating, in accordance with the access command, first data corresponding to the first address over a first data channel of the plurality of data channels; and communicating, in accordance with the access command, second data corresponding to the second address over a second data channel of the plurality of data channels.

Aspect 2: The method, apparatus, or non-transitory computer-readable medium of aspect 1, further including operations, features, circuitry, logic, means, or instructions, or any combination thereof for receiving one or more bits indicating as part of the access command indicating that the operation code applies to both the first address and the second address.

Aspect 3: The method, apparatus, or non-transitory computer-readable medium of any of aspects 1 through 2 where the access command is received over four unit intervals associated with the CA channel.

Aspect 4: The method, apparatus, or non-transitory computer-readable medium of aspect 3 where the operation code is received over a first unit interval of the four unit intervals, at least a portion of the first address is received over a second unit interval of the four unit intervals, and at least a portion of the second address is received over a third unit interval of the four unit intervals.

Aspect 5: The method, apparatus, or non-transitory computer-readable medium of aspect 4 where the access command includes a set of reserve bits communicated in the third unit interval of the four unit intervals; the third unit interval is after the first unit interval and the second unit interval and is before a fourth unit interval of the four unit intervals; and at least one conductive line used to communicate at least one bit of the set of reserve bits during the third unit interval is used to communicate the operation code during the first unit interval.

Aspect 6: The method, apparatus, or non-transitory computer-readable medium of any of aspects 1 through 5 where a twelfth bit of the access command received over a unit interval of the access command indicates that the operation code applies to both the first address and the second address.

Aspect 7: The method, apparatus, or non-transitory computer-readable medium of any of aspects 1 through 6, further including operations, features, circuitry, logic, means, or instructions, or any combination thereof for issuing the access command to a first portion of the memory die including the first address and to a second portion of the memory die including the second address over a same range of unit intervals.

Aspect 8: The method, apparatus, or non-transitory computer-readable medium of any of aspects 1 through 7, further including operations, features, circuitry, logic, means, or instructions, or any combination thereof for receiving, over the CA channel, a second access command including a second operation code that indicates a type of the second access command, a third address of the memory die targeted by the type of the second access command, and a fourth address of the memory die targeted by the type of the access command; communicating, in accordance with the second access command, third data corresponding to the third address over the first data channel; and communicating, in accordance with the second access command, fourth data corresponding to the fourth address over the second data channel.

Aspect 9: The method, apparatus, or non-transitory computer-readable medium of aspect 8, further including operations, features, circuitry, logic, means, or instructions, or any combination thereof for buffering the access command and the second access command and issuing the access command and the second access command to respective portions of the memory die over a same range of unit intervals.

Aspect 10: The method, apparatus, or non-transitory computer-readable medium of aspect 9, further including operations, features, circuitry, logic, means, or instructions, or any combination thereof for issuing the access command to a first portion of the memory die including the first address and to a second portion of the memory die including the second address over the same range of unit intervals and issuing the second access command to a third portion of the memory die including the third address and to a fourth portion of the memory die including the fourth address over the same range of unit intervals.

Aspect 11: The method, apparatus, or non-transitory computer-readable medium of any of aspects 9 through 10 where the same range of unit intervals is a same two unit intervals.

Aspect 12: The method, apparatus, or non-transitory computer-readable medium of any of aspects 1 through 11 where a first pseudo-channel of the memory die includes the first data channel and the CA channel and a second pseudo-channel of the memory die includes the second data channel and the CA channel.

Aspect 13: The method, apparatus, or non-transitory computer-readable medium of any of aspects 1 through 12 where communication of the first data over the first data channel and communication of the second data over the second data channel are initiated at a same time based at least in part on the operation code applying to both the first address and the second address.

Figure 9:
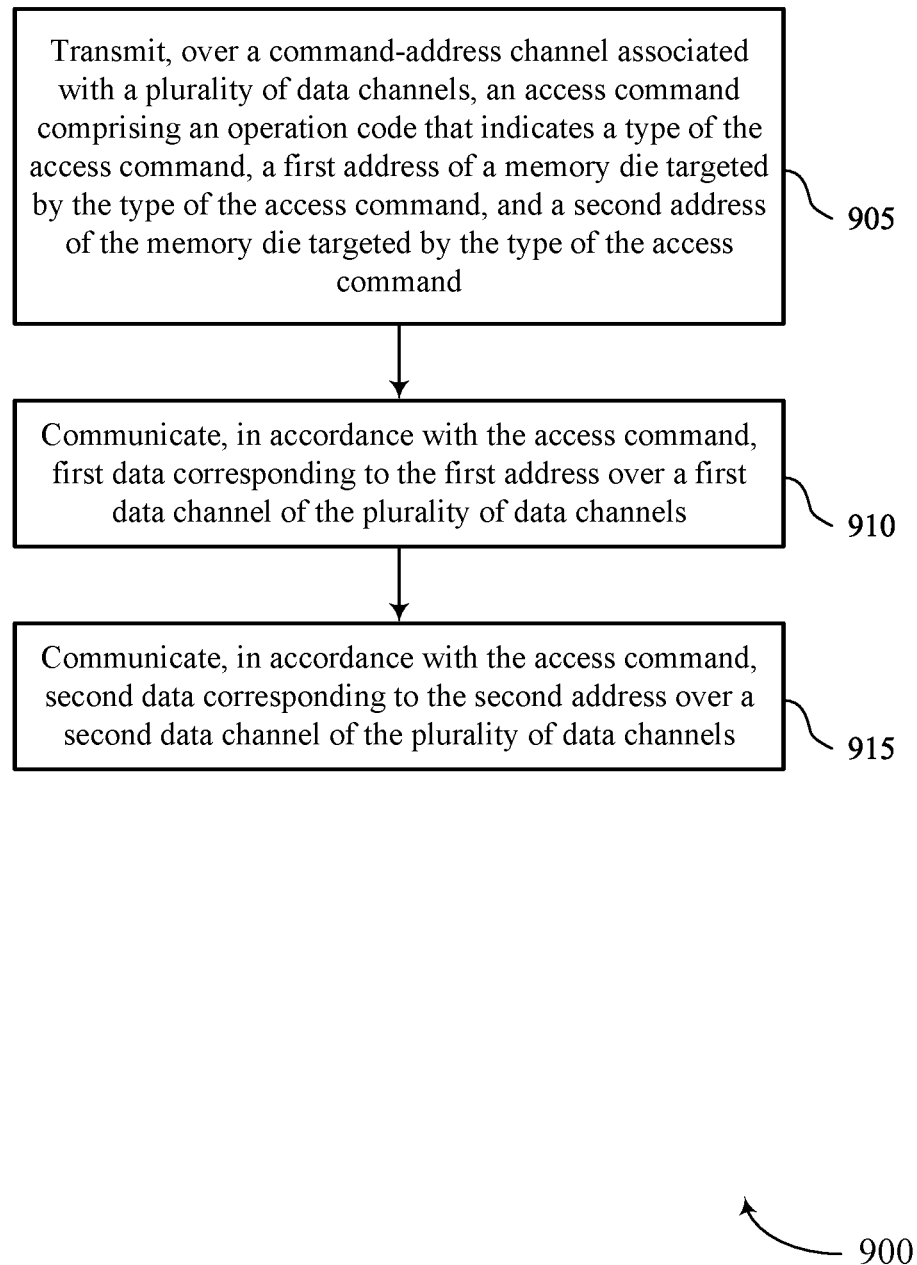

FIG. 9 shows a flowchart illustrating a method 900 that supports techniques for four cycle access commands in accordance with examples as disclosed herein. The operations of method 900 may be implemented by a host device or its components as described herein. For example, the operations of method 900 may be performed by a host device as described with reference to FIGS. 1 through 5 and 7. In some examples, a host device may execute a set of instructions to control the functional elements of the device to perform the described functions. Additionally, or alternatively, the host device may perform aspects of the described functions using special-purpose hardware.

At 905, the method may include transmitting, over a CA channel associated with a plurality of data channels, an access command including an operation code that indicates a type of the access command, a first address of a memory die targeted by the type of the access command, and a second address of the memory die targeted by the type of the access command. The operations of 905 may be performed in accordance with examples as disclosed with reference to FIGS. 2 through 5. In some examples, aspects of the operations of 905 may be performed by a command component 725 as described with reference to FIG. 7.

At 910, the method may include communicating, in accordance with the access command, first data corresponding to the first address over a first data channel of the plurality of data channels. The operations of 910 may be performed in accordance with examples as disclosed with reference to FIGS. 2, 4, and 5. In some examples, aspects of the operations of 910 may be performed by a first data channel component 730 as described with reference to FIG. 7.

At 915, the method may include communicating, in accordance with the access command, second data corresponding to the second address over a second data channel of the plurality of data channels. The operations of 915 may be performed in accordance with examples as disclosed with reference to FIGS. 2, 4, and 5. In some examples, aspects of the operations of 915 may be performed by a second data channel component 735 as described with reference to FIG. 7.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for transmitting, over a CA channel associated with a plurality of data channels, an access command including an operation code that indicates a type of the access command, a first address of a memory die targeted by the type of the access command, and a second address of the memory die targeted by the type of the access command; communicating, in accordance with the access command, first data corresponding to the first address over a first data channel of the plurality of data channels; and communicating, in accordance with the access command, second data corresponding to the second address over a second data channel of the plurality of data channels.

Aspect 15: The method, apparatus, or non-transitory computer-readable medium of aspect 14, further including operations, features, circuitry, logic, means, or instructions, or any combination thereof for transmitting one or more bits as part of the access command indicating that the operation code applies to both the first address and the second address.

Aspect 16: The method, apparatus, or non-transitory computer-readable medium of any of aspects 14 through 15 where the access command is transmitted over four unit intervals associated with the CA channel.

Aspect 17: The method, apparatus, or non-transitory computer-readable medium of aspect 16 where the operation code is transmitted over a first unit interval of the four unit intervals, at least a portion of the first address is transmitted over a second unit interval of the four unit intervals, and at least a portion of the second address is transmitted over a third unit interval of the four unit intervals.

Aspect 18: The method, apparatus, or non-transitory computer-readable medium of aspect 17 where the access command includes a set of reserve bits communicated in the third unit interval of the four unit intervals; the third unit interval is after the first unit interval and the second unit interval and is before a fourth unit interval of the four unit intervals; and at least one conductive line used to communicate at least one bit of the set of reserve bits during the third unit interval is used to communicate the operation code during the first unit interval.

Aspect 19: The method, apparatus, or non-transitory computer-readable medium of any of aspects 14 through 18 where a twelfth bit of the access command transmitted over a unit interval of the access command indicates that the operation code applies to both the first address and the second address.

Aspect 20: The method, apparatus, or non-transitory computer-readable medium of any of aspects 14 through 19, further including operations, features, circuitry, logic, means, or instructions, or any combination thereof for transmitting, over the CA channel, a second access command including a second operation code that indicates a type of the second access command, a third address of the memory die targeted by the type of the second access command, and a fourth address of the memory die targeted by the type of the access command; communicating, in accordance with the second access command, third data corresponding to the third address over the first data channel; and communicating, in accordance with the second access command, fourth data corresponding to the fourth address over the second data channel.

Aspect 21: The method, apparatus, or non-transitory computer-readable medium of any of aspects 14 through 20 where a first pseudo-channel of the memory die includes the first data channel and the CA channel and a second pseudo-channel of the memory die includes the second data channel and the CA channel.

Aspect 22: The method, apparatus, or non-transitory computer-readable medium of any of aspects 14 through 21 where communication of the first data over the first data channel and communication of the second data over the second data channel are initiated at a same time based at least in part on the operation code applying to both the first address and the second address.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, over a command-address channel associated with a plurality of data channels, an access command comprising an operation code that indicates a type of the access command, a first address of a memory die targeted by the type of the access command, and a second address of the memory die targeted by the type of the access command, wherein the access command is received over four unit intervals associated with the command-address channel;
   communicating, in accordance with the access command, first data corresponding to the first address over a first data channel of the plurality of data channels; and
   communicating, in accordance with the access command, second data corresponding to the second address over a second data channel of the plurality of data channels.

2. The method of claim 1, further comprising:
   receiving one or more bits indicating as part of the access command indicating that the operation code applies to both the first address and the second address.

3. The method of claim 1, wherein the operation code is received over a first unit interval of the four unit intervals, at least a portion of the first address is received over a second unit interval of the four unit intervals, and at least a portion of the second address is received over a third unit interval of the four unit intervals.

4. The method of claim 3, wherein:
   the access command comprises a set of reserve bits communicated in the third unit interval of the four unit intervals,
   the third unit interval is after the first unit interval and the second unit interval and is before a fourth unit interval of the four unit intervals, and
   at least one conductive line used to communicate at least one bit of the set of reserve bits during the third unit interval is used to communicate the operation code during the first unit interval.

5. The method of claim 1, wherein a twelfth bit of the access command received over a unit interval of the access command indicates that the operation code applies to both the first address and the second address.

6. The method of claim 1, further comprising:
   issuing the access command to a first portion of the memory die comprising the first address and to a second portion of the memory die comprising the second address over a same range of unit intervals.

7. The method of claim 1, further comprising:
   receiving, over the command-address channel, a second access command comprising a second operation code that indicates a type of the second access command, a third address of the memory die targeted by the type of the second access command, and a fourth address of the memory die targeted by the type of the access command;
   communicating, in accordance with the second access command, third data corresponding to the third address over the first data channel; and
   communicating, in accordance with the second access command, fourth data corresponding to the fourth address over the second data channel.

8. The method of claim 7, further comprising:
   buffering the access command and the second access command; and
   issuing the access command and the second access command to respective portions of the memory die over a same range of unit intervals.

9. The method of claim 8, further comprising:
   issuing the access command to a first portion of the memory die comprising the first address and to a second portion of the memory die comprising the second address over the same range of unit intervals; and
   issuing the second access command to a third portion of the memory die comprising the third address and to a fourth portion of the memory die comprising the fourth address over the same range of unit intervals.

10. The method of claim 8, wherein the same range of unit intervals is a same two unit intervals.

11. The method of claim 1, wherein:
    a first pseudo-channel of the memory die comprises the first data channel and the command-address channel, and
    a second pseudo-channel of the memory die comprises the second data channel and the command-address channel.

12. The method of claim 1, wherein communication of the first data over the first data channel and communication of the second data over the second data channel are initiated at a same time based at least in part on the operation code applying to both the first address and the second address.

13. A method, comprising:
    transmitting, over a command-address channel associated with a plurality of data channels, an access command comprising an operation code that indicates a type of the access command, a first address of a memory die targeted by the type of the access command, and a second address of the memory die targeted by the type of the access command, wherein the access command is transmitted over four unit intervals associated with the command-address channel;
    communicating, in accordance with the access command, first data corresponding to the first address over a first data channel of the plurality of data channels; and
    communicating, in accordance with the access command, second data corresponding to the second address over a second data channel of the plurality of data channels.

14. The method of claim 13, further comprising:
transmitting one or more bits as part of the access command indicating that the operation code applies to both the first address and the second address.

15. The method of claim 13, wherein the operation code is transmitted over a first unit interval of the four unit intervals, at least a portion of the first address is transmitted over a second unit interval of the four unit intervals, and at least a portion of the second address is transmitted over a third unit interval of the four unit intervals.

16. The method of claim 15, wherein:
the access command comprises a set of reserve bits communicated in the third unit interval of the four unit intervals,
the third unit interval is after the first unit interval and the second unit interval and is before a fourth unit interval of the four unit intervals, and
at least one conductive line used to communicate at least one bit of the set of reserve bits during the third unit interval is used to communicate the operation code during the first unit interval.

17. The method of claim 13, wherein a twelfth bit of the access command transmitted over a unit interval of the access command indicates that the operation code applies to both the first address and the second address.

18. An apparatus, comprising:
a memory die; and
logic configured to cause the apparatus to:
receive, over a command-address channel associated with a plurality of data channels, an access command comprising an operation code that indicates a type of the access command, a first address of the memory die targeted by the type of the access command, and a second address of the memory die targeted by the type of the access command, wherein the access command is received over four unit intervals associated with the command-address channel;
communicate, in accordance with the access command, first data corresponding to the first address over a first data channel of the plurality of data channels; and
communicate, in accordance with the access command, second data corresponding to the second address over a second data channel of the plurality of data channels.

* * * * *